United States Patent [19]

Schindler et al.

[11] Patent Number: 5,227,734
[45] Date of Patent: Jul. 13, 1993

[54] BROADBAND BIPOLAR TRANSISTOR DISTRIBUTED AMPLIFIER

[75] Inventors: Manfred J. Schindler, Newton, Mass.; Marc E. Goldfarb, Atkinson, N.H.; J. Bradford Cole, Chelmsford; Aryeh Platzker, Belmont, both of Mass.

[73] Assignee: Raytheon Company, Lexington, Mass.

[21] Appl. No.: 964,109

[22] Filed: Oct. 20, 1992

Related U.S. Application Data

[63] Continuation of Ser. No. 749,794, Aug. 26, 1991, abandoned.

[51] Int. Cl.$^5$ .............................................. H03F 3/60
[52] U.S. Cl. ..................................... 330/54; 330/277; 330/286
[58] Field of Search ..................... 330/54, 55, 53, 277, 330/286, 311

[56] References Cited

U.S. PATENT DOCUMENTS

| | | | |
|---|---|---|---|
| 4,446,445 | 5/1984 | Apel | 330/286 |
| 4,543,535 | 9/1985 | Ayasli | 330/53 |
| 4,788,511 | 11/1988 | Schindler | 330/54 |
| 5,066,926 | 11/1991 | Ramachandran et al. | 330/286 |
| 5,166,640 | 11/1992 | Fathimulla et al. | 330/54 |

FOREIGN PATENT DOCUMENTS

| | | | |
|---|---|---|---|
| 674200 | 7/1979 | U.S.S.R. | 330/286 |
| 675583 | 7/1979 | U.S.S.R. | 330/54 |

Primary Examiner—Robert J. Pascal
Assistant Examiner—Tan Dinh
Attorney, Agent, or Firm—Richard M. Sharkansky

[57] ABSTRACT

A distributed circuit includes a plurality of pairs of cascode coupled first and second transistors with each transistor having base, emitter, and collector electrodes. The first transistor of each pair is disposed to have a first one of emitter and collector electrodes coupled to a reference potential and the second one of said transistors of each pair is disposed to have the base electrode coupled to a reference potential with the second one the collector and emitter electrodes of the first transistor of each pair being coupled to the emitter electrode of the corresponding second transistor of each pair. The network further includes an input propagation network disposed to successively couple the base electrode of each one of the first transistors of each pair of transistors to an input terminal and an output propagation network disposed to couple the collector electrodes of each one of the second transistors of each one of the pair of transistors to an output terminal of the circuit.

27 Claims, 6 Drawing Sheets

FREQUENCY RANGE
1.0 TO 30.0GHz

MARKED FREQUENCIES

A: 2.0 GHz
B: 4.0 GHz
C: 10.0 GHz
D: 20.0 GHz

*Fig. 4A*

FREQUENCY RANGE
1.0 TO 30.0GHz

MARKED FREQUENCIES

A: 2.0 GHz
B: 4.0 GHz
C: 10.0 GHz
D: 20.0 GHz

*Fig. 4B*

FREQUENCY RANGE
1.0 TO 30.0 GHz

MARKED FREQUENCIES

A: 2.0 GHz
B: 4.0 GHz
C: 10.0 GHz
D: 20.0 GHz

*Fig. 4C*

FREQUENCY RANGE
1.0 TO 30.0 GHz

MARKED FREQUENCIES

A: 2.0 GHz
B: 4.0 GHz
C: 10.0 GHz
D: 20.0 GHz

*Fig. 5A*

FREQUENCY RANGE
1.0 TO 30.0 GHz

MARKED FREQUENCIES

A: 2.0 GHz
B: 4.0 GHz
C: 10.0 GHz
D: 20.0 GHz

*Fig. 5B*

BROADBAND BIPOLAR TRANSISTOR DISTRIBUTED AMPLIFIER

This application is a continuation of application Ser. No. 749,794 filed Aug. 26, 1991 and now abandoned.

BACKGROUND OF THE INVENTION

This invention relates generally to radio frequency circuits and more particularly to radio frequency distributed circuits.

As is known in the art, radio frequency distributed circuits are well known to provide various circuit functions particularly over broad bands of microwave frequencies. For example, such distributed circuits can be used to provide mixers, amplifiers, and switches. In particular, one type of distributed circuit commonly referred to as a distributed amplifier includes a plurality of successively interconnected active elements and has been shown to provide amplification of radio frequency signals.

Many examples of such distributed amplifiers are known. Modern distributed amplifiers have active elements provided as field effect transistors and particularly so-called metal semiconductor field effect transistors (MESFETs) fabricated on a Group III-V material, such as gallium arsenide. Earlier attempts in making distributed amplifiers prior to the advent of the field effect transistor used vacuum tubes. Both field effect transistors and, in particular, vacuum tubes lent themselves to use in distributed circuit applications since their input and output impedances are relatively high and primarily capacitive over a broad range of operating frequencies.

As it is known, distributed amplifiers are operative over broad bandwidths, and accomplish this by providing a network which includes the input and output impedances of each one of the active elements in combination with the input and output lines. By incorporating the input and output impedances into the propagation networks a suitable impedance characteristic is maintained over a broad range of operating frequencies.

In the past there have been attempts to make distributed amplifiers using bipolar transistors. These earlier attempts, in general, had not been very successful since the characteristics of a bipolar transistor do not lend themselves easily to incorporation into a distributed circuit topology. Generally bipolar transistors have relatively low input impedances which are primarily resistive rather than capacitive. Accordingly, it is not possible to obtain the equivalent distributed transmission line structure by incorporating the input impedance of the device with a transmission line.

One approach to providing such a bipolar distributed amplifier includes passive impedance matching networks disposed at the input and output of each one of the bipolar transistors. There are several problems with this approach. One problem is that the passive impedance matching networks have the undesired effect of reducing the bandwidth of the device. Since bandwidth is the most attractive attribute of the distributed amplifier, this drawback is quite undesirable. Furthermore, the use of passive impedance matching networks for each device would only serve to increase the size of the device as well as circuit complexity, thus making the amplifier more expensive and less reliable. Given the above limitations, it is apparent why bipolar implementations of distributed circuits and particularly distributed amplifiers were not widely used.

With modern monolithic microwave integrated circuits and operation at microwave and millimeter wave frequencies, the preferred approach for providing a distributed amplifier is to provide the distributed amplifier as a monolithic microwave integrated circuit. With MESFET field effect transistors as the active devices in such a circuit, one problem is that output power from the circuit is relatively low. This limitation in output power is the result of relatively low breakdown voltage characteristics of MESFETs, limited current capabilities, as well as the load impedance characteristics presented to MESFETs being strongly dependent upon the frequency of operation of the MESFETs and signal levels fed to the MESFETs. One approach known in the art for overcoming these problems is described in U.S. Pat. No. 4,543,535 assigned to the assignee of the present invention. Nevertheless, higher powers than those which may be obtained by the use of field effect transistors would be desirable.

Recent developments in device technology have provided major gains in the development of high performance heterojunction bipolar transistors. As generally known, a bipolar transistor includes a pair of junction regions formed by interposing a base region of a first carrier polarity between a pair of collector and emitter regions of a second carrier polarity. Thus, p-n-p and n-p-n structures are provided. That is, semiconductor material being doped with P-type carriers or holes and N-type carriers or electrons are provided. In silicon based technologies, known dopants for P-type and N-type materials are readily available and quite acceptable. However, silicon is not a preferred material for use of microwave frequencies because it has a relatively low saturation carrier velocity. At microwave frequencies, materials of choice are Group III-V materials, such as gallium arsenide. With gallium arsenide, a problem exists in attempting to provide a bipolar transistor since the bipolar transistor requires the use at least one P-type layer. There are no known suitable P-type dopant materials for Group III-V materials, such as gallium arsenide, since the known P-type dopant materials generally have very low saturation carrier velocities and mobilities in comparison to the known N-type dopant materials. These drawbacks, therefore, prevent devices incorporating P-type dopants from exhibiting the relatively high frequency operation performance commonly expected with the use of Group III-V materials.

However, the development of the heterojunction bipolar transistor has obviated many of these problems. In general, the heterojunction bipolar transistor includes a heterojunction comprised of a wide bandgap Group III-V material, such as aluminum gallium arsenide, which acts as an emitter layer and a lower bandgap material, such as gallium arsenide or indium gallium arsenide, which acts as a base layer. Since the bandgap difference between the two layers is relatively large by use of the higher bandgap aluminum gallium arsenide material, the base layer can be more heavily doped with P-type material for an n-p-n device, for example, thereby compensating substantially for the general lack of suitable performance characteristics of P-type dopants in gallium arsenide.

Heterojunction bipolar transistors would be widely acceptable for use in distributed amplifier applications particularly since the heterojunction bipolar transistor generally has higher power capabilities with higher gain than the MESFET. However, the heterojunction bipolar transistor has similar problems as bipolar transistors. Generally, the heterojunction bipolar transistor has a relatively low input impedance characteristic which is primarily resistive rather than capacitive. Therefore, in order to use heterojunction bipolar transistors in applications particularly requiring broadband and high output power, a different configuration or a different approach for implementation of a distributed circuit needs to be used.

SUMMARY OF THE INVENTION

In accordance with the present invention, a distributed circuit includes a plurality of pairs of cascode coupled first and second transistors, with each transistor being a bipolar transistor having base, emitter, and collector electrodes. The first transistor of each pair is disposed to have a first one of emitter and collector electrodes coupled to a reference potential and the second one of said transistors of each pair is disposed to have the base electrode coupled to a reference potential with the second one of the collector and emitter electrodes of the first transistor of each pair being coupled to the emitter electrode of the corresponding second transistor of each pair. The network further includes an input propagation network disposed to successively couple the base electrode of each one of the first transistors of each of the plurality of pairs of transistors to an input terminal of the circuit and an output propagation network disposed to successively couple the collector electrodes of each one of the second transistors of each of the plurality of pairs of transistors to an output terminal of the circuit. With this particular arrangement, some of the impedance restrictions imposed by the impedance characteristics of the bipolar transistor are obviated. In particular, by providing pairs of cascode coupled transistors, the impedance characteristics of each one of the transistors can be selected to provide corresponding impedance characteristics to the cascode coupled transistor pairs. That is, the first transistor may be provided in the configuration which provides a requisite input impedance characteristic to each of the cascode coupled transistor pairs thus permitting the active elements to be successively coupled by an input propagation network to provide a distributed network, whereas the configuration of the second transistor is selected to provide an output impedance characteristic which, in combination with the output propagation network, provides a distributed output network for the circuit. The use of a pair of transistors therefore permits tailoring of the input and output impedance characteristics of the cascode coupled pair without substantially reducing the bandwidth of the circuit or increasing its complexity. The use of bipolar transistors provides a circuit which can handle high input power and provide high output power.

In accordance with a further aspect of the present invention, the first transistor of each one of the pair of transistors has a capacitor coupled in series between the base electrode of said first transistor and the input propagation network. With this particular arrangement by providing the capacitors coupled in series between the input propagation network and the base electrode of the corresponding first transistor, the input impedance characteristics of each of the first transistors will be substantially more capacitive. This arrangement further aids in providing, in combination with the input propagation network, a network having a predetermined input impedance over a broad range of operating frequencies.

In accordance with a further aspect of the present invention, a distributed circuit includes a plurality of successively coupled gain cells, each cell including first and second pairs of cascode coupled transistors. Each transistor of each pair has base, collector, and emitter electrodes. Each pair of transistors is disposed to have a first transistor coupled in a common emitter configuration and coupled to a second transistor which is coupled in a common base configuration. Each transistor of the first pair of transistors is an n-p-n type transistor and each transistor of the second pair of transistors is an p-n-p type transistor. An input propagation network is disposed to successively couple the base electrodes of first transistors of the first and second pairs of transistors of each gain cell to an input terminal. An output propagation network is disposed to successively couple the collector electrodes of second transistors of each of the first and second pairs of transistors of each of the gain cells to an output terminal of the amplifier. With this particular arrangement, a broadband, push-pull amplifier is provided. The amplifier can be biased to operate as a Class B power amplifier. Accordingly, it will have higher efficiencies than a conventional single-ended Class A amplifier. Further, by using common emitter coupled transistors at the input and common base coupled transistors at the output stage of each of the gain cells, the input and output impedance characteristics of the amplifier circuit can be tailored to provide a distributed circuit over broad ranges of operating frequencies.

Further, with this arrangement, optional base coupling capacitors can be coupled between the base electrodes of the first transistors of each first and second pair of transistors of each cell and the input propagation network to provide an input propagation network having a desired characteristic impedance over a broad range of operating frequencies.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
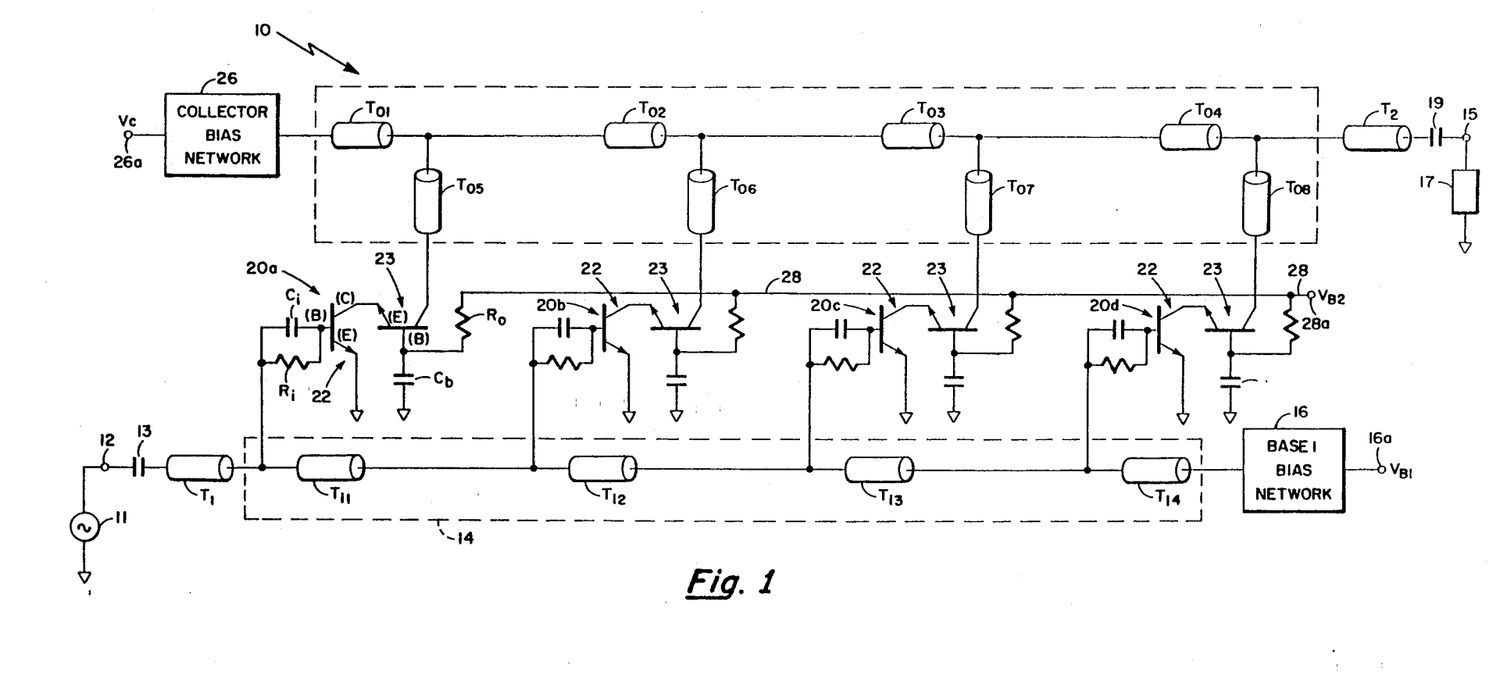
FIG. 1 is a schematic representation of a distributed amplifier using a plurality of common emitter, common base cascode connected cells.

Referring now to FIG. 1, a distributed circuit, here a distributed amplifier 10 is shown to include an input terminal 12 and an output terminal 16. Input terminal 12 is fed by an input source 11 to provide an amplified output signal at terminal 15 and deliver such output signal to a load 17. Generally the input signal source 11 will have a predetermined output impedance $Z_0$ typically equal to 50 ohms or other suitable characteristic impedances as is known, and the load 17 will also have a correspondingly similar input characteristic impedance $Z_0$ generally equal to the characteristic impedance of the source 11. In order to provide amplification over a broad range of operating frequencies, therefore, it is desirable that circuit 10 has an overall impedance characteristic at its input network and its output network which is substantially equal to the system characteristic impedance, $Z_0$, which again, as mentioned above, is typically 50 ohms.

Thus, network 10 is here shown to further include a DC blocking capacitor 13 coupled between input terminal 12 and an input transmission line section $T_1$ with line $T_1$ having a characteristic impedance here also equal to the system characteristic impedance $Z_0$. In general, it is preferred here that each of the transmission lines are microstrip type of transmission lines although other types may be used. An input propagation network 14 is shown comprised of transmission line sections $T_{i1}-T_{i4}$ which are disposed to successively couple input electrodes (B, as referenced for transistor 22 of pair 20a) of a plurality of cascoded transistor pairs 20a-20d. Here each one of the cascode pairs 20a-20d are substantially identical possibly differing only in terms of the size of the actual transistors employed in a particular amplifier circuit but nevertheless generally coupled in the manner as will be described in conjunction for cascode pair 20a. Further, each of the cascode pairs, 20a-20d, here include a so-called common emitter configured heterojunction bipolar transistor coupled to a common base configured heterojunction bipolar transistor. This particular configuration of the cascode transistor pairs is preferred for reasons to be discussed later although other cascoded pairs as will also be discussed later may alternatively be used.

Now using cascode pair 20a as an illustrative example, pair 20a includes a first transistor 22, here the input transistor coupled in the so-called common emitter configuration, having an emitter electrode (E) coupled to a reference potential such as ground, a collector electrode (C) coupled to a succeeding transistor 23, as will be described, and a base electrode (B) coupled to the input propagation network 14, as mentioned above. Preferably, it is desirable to couple the base electrode (B) to the input propagation network 14 through a capacitor $C_i$ although other arrangements may alternatively be used. In general, $C_i$ is selected to provide a substantially capacitive input impedance characteristic at the input of the cascode transistor pair 20a. A resistor $R_1$ is also shown coupled in shunt across capacitor $C_i$ and is used to provide a DC bias which is fed from bias network 16 along transmission line sections $T_{i4}-T_{i1}$. Other DC biasing arrangements such as inductors, as well as a common DC bias line fed to resistors or inductors, may alternatively be used. The collector electrode (C) of transistor 22 is here coupled directly to an emitter electrode (E) of transistor 23. In practical applications of this invention, however, it might be preferred to interpose some interstage matching network between collector electrode (C) of transistor 22 and emitter electrode (E) of transistor 23 to take into consideration parasitics which may occur due to a particular circuit layout of the individual circuit elements. The transistor 23 further has a collector electrode coupled to an output propagation network 18, as will be described, and a base electrode coupled via a DC blocking capacitor $C_B$ to a reference potential, here ground. A resistor (R) is shown coupled to a DC bias line 28 which is used to provide base electrode bias to the second transistor 23 of cascode pair 20a.

Similarly, each one of the cascode pairs 20b-20d have first transistors 22 and second transistors 23 and associated capacitors (not referenced) which are cascode interconnected in a similar manner as generally described in conjunction with cascode connected pair 20a. In general, each of the transistors 22 are identical as are each of the transistors 23. However, for certain applications the size of the transistors may be varied to take into consideration power handling and impedance considerations as would be apparent to one of skill in the art. The plurality of cascode pairs 20a-20d have output electrodes here collector electrodes (C) as shown for pair 20a of the second transistors 23 successively coupled via transmission line sections $T_{O1}-T_{O4}$ to a second transmission line $T_2$, which is coupled via a DC blocking capacitor 19 to output terminal 16. Optionally, transmission line sections $T_{O5}-T_{O8}$ are disposed to couple the collector electrode (C) of transistors 23 to the aforementioned transmission lines $T_{O1}-T_{O4}$. $T_{O4}$. Thus, transmission lines $T_{O1}-T_{O8}$ provide, in combination with the output impedances of transistors 23, an output propagation network 18. Further, it should be understood, however, the transmission line sections $T_{O5}-T_{O8}$ are used to provide phase velocity matching of the signals through each one of the signal paths provided by the cascode connected transistor pairs 20a-20d but are optional in that the phase velocity matching provided by said transmission lines $T_{O5}-T_{O8}$ could alternatively be incorporated into the aforementioned transmission line sections $T_{O1}-T_{O4}$.

Bias networks 16 and 26 are also shown disposed to terminate the ends of networks 14 and 18, respectively. The bias networks are conventional ladder type networks which are used to provide a predetermined impedance characteristic at the ends of said lines here said impedance characteristic generally being similar to the system impedance characteristic $Z_0$, mentioned earlier, and are also used to permit the application of a DC potential along input bias terminals 16a and 26a, respectively as shown. In some cases, low or high impedance termination may be used to increase power and efficiency, although generally at the cost of bandwidth. Since an RF signal is generally not present along conductor 28, a bias network is not necessary to isolate terminal 28a. However, if needed, an RF choke may be used in series with conductor 28 to provide adequate RF isolation at terminal 28a.

Figure 2:
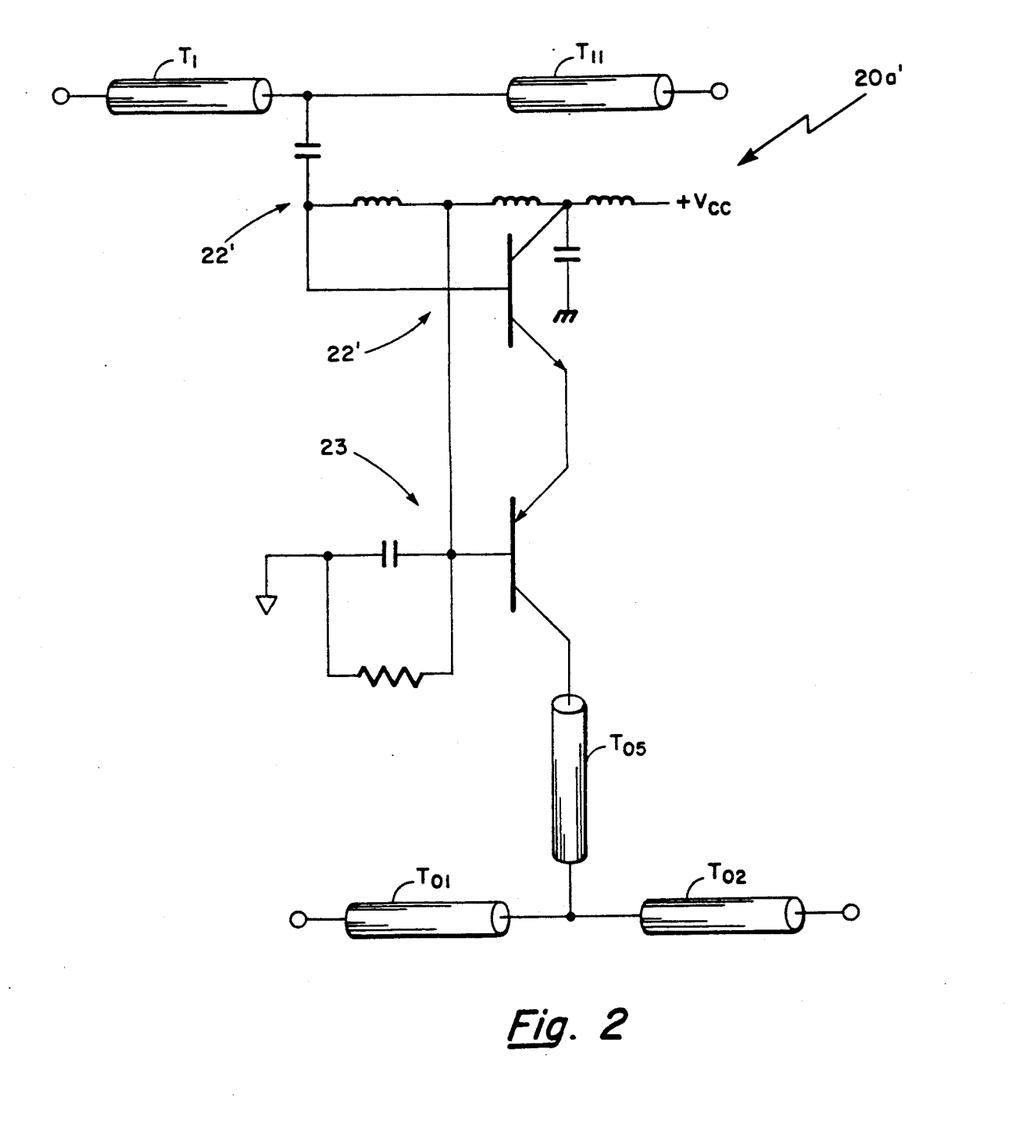
FIG. 2 is a schematic representation of an alternate embodiment of the transistor cells for use in the amplifier circuit described in conjunction with FIG. 1.

Referring now to FIG. 2, an alternate arrangement 20a' for the cascode connected cells 20a-20d (FIG. 1) is shown. Although only cascode cell 20a' is shown, it is understood that additional ones of such cells are, in general, used, as described for cells 20b-20d (FIG. 1). Here cascode cell 20a' is coupled between lines $T_{i1}$ and $T_{O1}$ and is shown to include a transistor 22' connected in a common collector or emitter-follower configuration, coupled to a common base transistor 23, as described in conjunction with FIG. 1. The common collector connected transistor 22' is here a first one of an n-p-n and p-n-p type whereas the common base transistor is the second one of the n-p-n and p-n-p type. Here an n-p-n and p-n-p configuration is shown for the transistor pairs 22', 23 although the other configuration (i.e. a p-n-p and n-p-n configuration) could alternatively be used. Bias is provided to this cascode pair 20a' by inductors $L_1$-$L_3$ and diodes $D_1$, $D_2$, as shown. If the current gain $\beta$ of the transistor is high, these inductors $L_1$-$L_3$ may be replaced by resistors.

Figure 3:
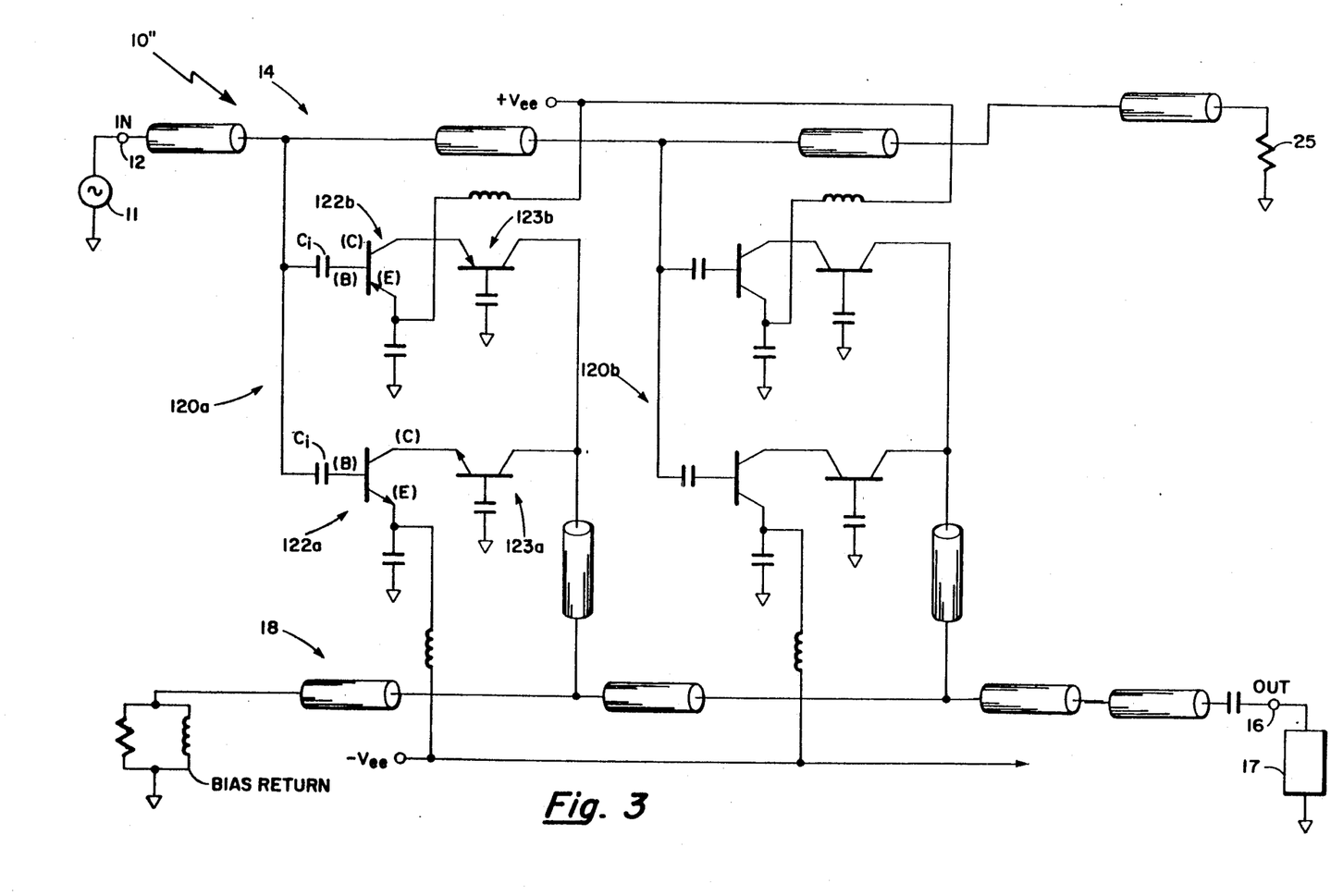
FIG. 3 is a schematic representation of a push-pull configuration of a distributed circuit including cascode coupled transistors.

Referring now to FIG. 3, an alternate embodiment 10'' of the distributed circuit, such as a distributed amplifier, is shown to include the circuit elements as generally described in conjunction with FIG. 1, that is, an input propagation network 14 and an output propagation network 18, signal sources 11 and input terminal 12, output terminal 15, and load 17, a bias return (or ground return) network 26 and a termination 25. Here, however, the input propagation network 14 is coupled to the output propagation network 18 via a plurality of push-pull cascode coupled transistor gain cells 120a, 120b, as shown. Here two cells are shown although others may be provided and are generally inferred from the FIG. Each one of the push-pull cascode coupled cells 120a, 120b includes (as referenced for cell 120a) a pair of input transistors 122a, 122b here coupled in the common emitter configuration but alternatively could also be coupled in a common collector configuration as described above (FIG. 2) with a first one of the transistors 122a being an n-p-n type, whereas the second one of the transistors here 122b being a p-n-p type transistor. As mentioned, the transistors 122a, 122b are coupled in a common emitter combination. Thus, emitter electrodes (E) of such transistors are coupled to an RF reference potential here via DC blocking capacitor C to ground. The base electrodes of said transistors (B) are coupled via capacitors $C_i$ to the input propagation network 14, whereas the collector electrodes (C) of transistors 122a, 122b are coupled to emitter electrodes (E) of the output transistors 123a, 123b of the cell 120a. Here output transistors 123a, 123b have first ones of n-p-n and p-n-p types with transistor 123a being the same polarity type as transistor 122a and transistor 123b being the same polarity type as transistor 122b. Thus, in the example described, transistor 123a is a n-p-n type, whereas transistor 123b is a p-n-p type. The transistors 123a, 123b are coupled in a common base configuration and thus have base electrodes being coupled via DC blocking capacitor $C_B$ to a reference potential and have emitter electrodes (C) coupled via capacitors $C_0$ to the output propagation network 18. It should be noted that the base biasing networks have not been shown in this figure, but they could be the same as those shown in FIG. 1.

The use of the push-pull configuration of cascode coupled transistor pairs provides further improvements. For example, the push-pull cells 120a, 120b, etc. provide the desired input and output impedances of each one of the cells, as mentioned above in conjunction with FIG. 1. Further, the push-pull configuration permits the amplifier 10'' to operate in the class B or Class AB mode thereby improving efficiency and increasing output power capabilities for the amplifier.

Each of the above circuits have cascode coupled transistor pairs such as the common emitter coupled to the common base transistor or the common collector coupled to the common base transistor. The use of the cascode pairs provides for a transistor cell which can provide high voltage gain and output power characteristics. The input impedance characteristic is generally that of the common emitter and is substantially resistive rather than the desired capacitive. The output impedance of the common base cells is primarily capacitive. To improve circuit performance, therefore, the input capacitors $C_i$ are preferably disposed between the base electrodes of each one of the common collector or common emitter coupled transistors and the input propagation network 14. A relatively low value of capacitance is chosen for capacitors $C_i$ to provide an input impedance characteristic to each one of the transistors 22 which is primarily capacitive. The primarily capacitive impedance characteristic of transistors 22 provide, in combination with transmission line sections $T_{i1}$-$T_{i4}$, the network 14 having a characteristic impedance which can be selected with the characteristic impedance of transmission line $T_1$.

A common emitter bipolar transistor has an input impedance characteristic which is primarily resistive and an output impedance characteristic which is very reactive representing a very large capacitance. Neither of these impedance characteristics are preferred for providing a distributed amplifier network of heterojunction bipolar transistors. On the other hand, a common base coupled heterojunction bipolar transistor has an input impedance which is purely resistive but an output impedance which is moderately capacitive. Therefore, the cascode connection of the common emitter heterojunction bipolar transistor and the common base heterojunction bipolar transistor provides a network having a desirable output impedance characteristic which is provided by the common base device. The use of the input capacitance on the common emitter transistor provides an input impedance which is generally preferable to the input impedance of the common emitter without the capacitor.

Figure 4A:
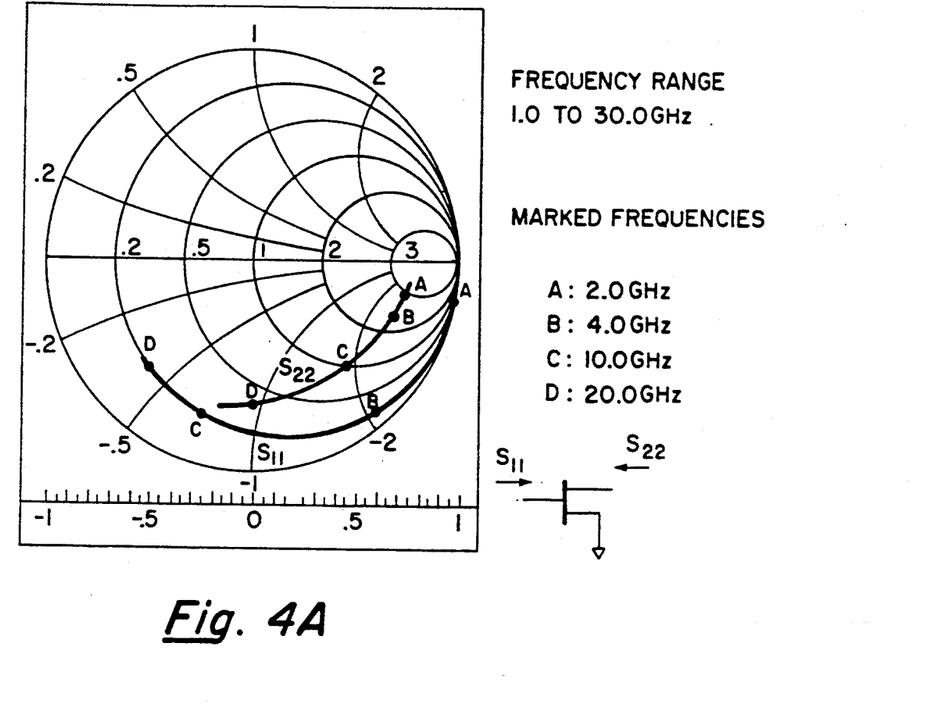
FIGS. 4A–4C are Smith chart representations of the impedance characteristics of typical MESFET and heterojunction bipolar transistors in various configurations.
Figure 4B:
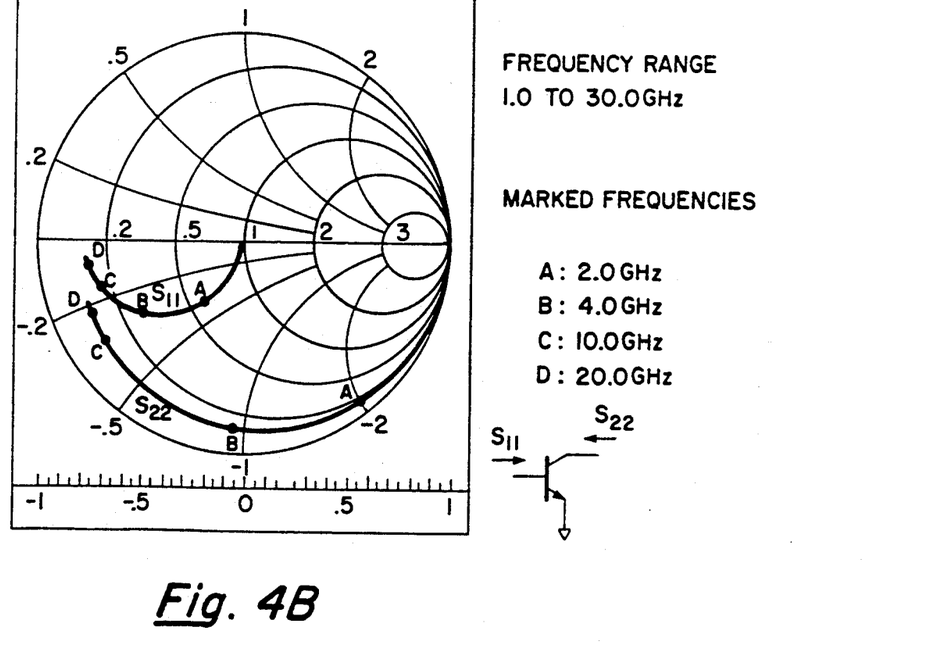
Figure 4C:
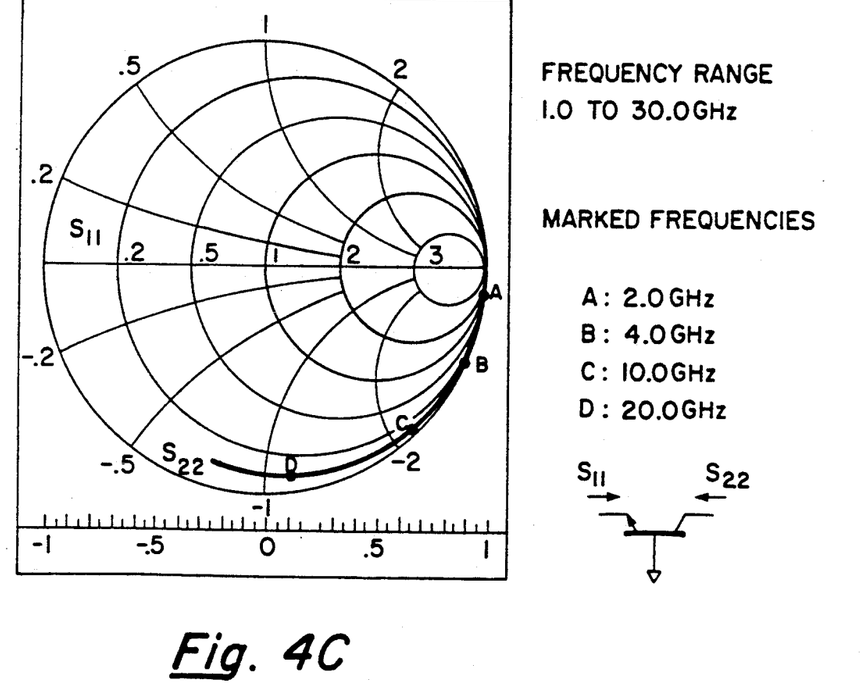

Referring now to FIGS. 4A–4C, the input impedances represented by scattering perimeter $S_{11}$ and the output impedances represented by scattering perimeter $S_{22}$ of a standard power metal semiconductor field effect transistor having a total gate periphery of 350 microns (FIG. 4A), a common emitter heterojunction bipolar transistor having four base electrode fingers each finger being 3 microns wide by 20 microns long (FIG. 4B), and a common base heterojunction bipolar transistor having four base electrode fingers each finger being 3 microns wide by 20 microns long (FIG. 4C) are shown. As noted, the input and output impedances of the MESFET are both substantially capacitive in nature, whereas the input impedance of the common emitter heterojunction bipolar transistor is somewhat resistive in nature and with the output impedance of the common emitter heterojunction bipolar transistor being highly capacitive in nature. On the other hand, the input impedance characteristic of the common base coupled heterojunction bipolar transistor is nearly purely resistive in nature, whereas the output impedance is moderately capacitive in nature.

Figure 5A:
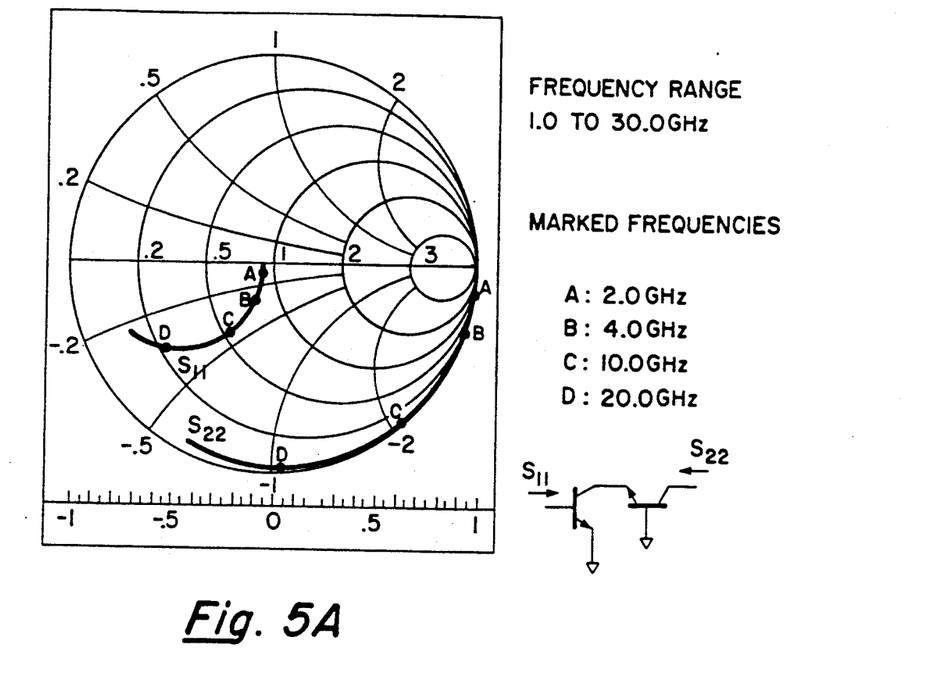
FIGS. 5A–5B are Smith chart representations of the impedance characteristics of cascode connected transistors in accordance with the present invention.
Figure 5B:
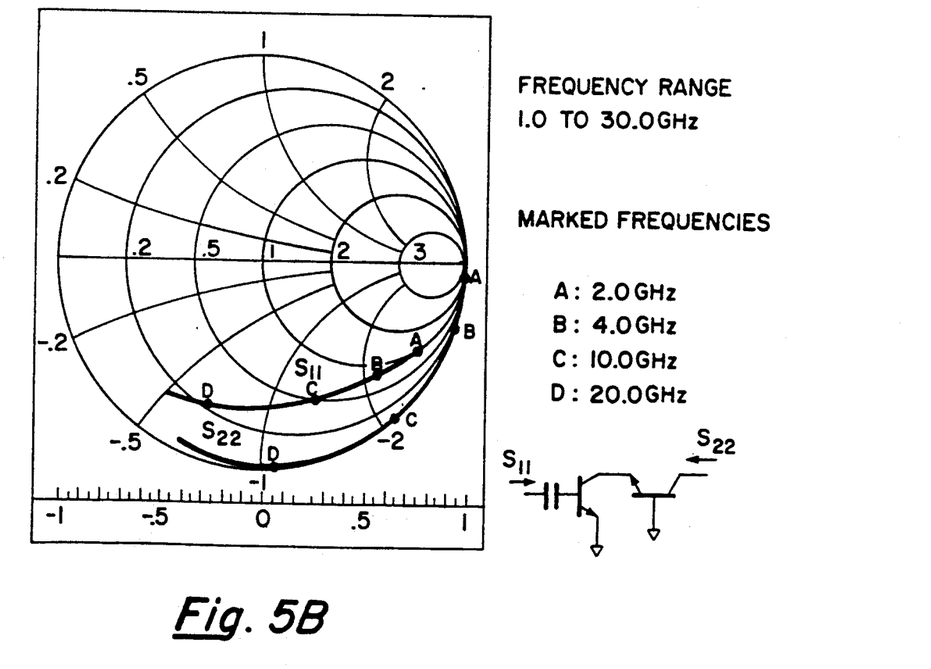

As shown in FIGS. 5A and 5B, a cascoded heterojunction bipolar transistor pair including a common emitter and a common base heterojunction bipolar transistors exhibit (FIG. 5A) an output impedance which is moderately capacitive and an input impedance which is substantially similar to the input impedance of the common emitter, as indicated above. The same cascode arrangement including the input capacitor $C_i$ exhibits an input impedance characteristic $S_{11}$ (FIG. 5B) which is more capacitive in nature and which when compared with the MESFET characteristics described in conjunction with FIG. 4A provides active or gain element cascode cells which are preferred as elements in a distributed structure to operate over a broad range of operating frequencies.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. In combination:

a plurality of capacitors;

a plurality of pairs of cascode coupled bipolar transistors, each transistor having input, output, and reference electrodes with a first one of the transistors of each pair disposed to be coupled in a first configuration to provide a first input impedance characteristic, and a second one of the transistors of each pair disposed to be coupled in a second configuration to provide a first output impedance characteristic with the output electrodes of said first transistor being coupled to the input electrode of said second transistor, the reference electrode of the first transistor being biased to a reference potential;

an input propagation network including said plurality of capacitors with said input propagation network and capacitors disposed to successively couple the input electrodes of each one of the first transistors; and an output propagation network disposed to successively couple the output electrodes of each one of said second transistors.

2. The combination, as recited in claim 1, wherein the input propagation network provides in combination with the input impedance of each one of the first transistors and capacitances of said plurality of capacitors, a network having a characteristic impedance substantially related to an impedance of a signal source coupled to an input terminal of said combination.

3. The combination, as recited in claim 1, wherein said output propagation network provides in combination with the output impedance of each one of said second transistors, an output network having a characteristic impedance substantially related to a characteristic impedance of a load coupled to an output terminal of said combination.

4. In combination:

a plurality of capacitors;

a corresponding plurality of pairs of cascode coupled bipolar transistors, each transistor having base, emitter, and collector electrodes with a first one of the transistors of each pair having a base electrode coupled to a first end of one of said plurality of capacitors, and a first one of collector and emitter electrodes biased at a reference potential, and a second one of the transistors of each pair disposed to have the base electrode thereof coupled to a reference potential and with a second one of the collector and emitter electrodes of said first transistor coupled to the emitter electrode of said second transistor;

an input propagation network disposed to successively couple the second end of each one of the capacitors; and an output propagation network disposed to successively couple the collector electrodes of each one of said second transistors.

5. The combination, as recited in claim 4, wherein the first transistors of each of the plurality of pairs of cascode coupled transistors have the emitter electrode biased at a reference potential.

6. The combination, as recited in claim 5, wherein the input network provides in combination with the input impedance of each one of the first transistors, a network having a predetermined characteristic impedance substantially related to an impedance of a signal source coupled to an input terminal of said combination.

7. The combination, as recited in claim 5, wherein each one of said first and second transistors are heterojunction bipolar transistors comprised of Group III-V semiconductor materials.

8. The combination, as recited in claim 5, wherein each of the plurality of capacitors, the input propagation network, and input impedances of said plurality of transistors, provides said input propagation network having a characteristic impedance substantially related to a characteristic impedance of a source coupled to an input terminal of said combination.

9. The combination, as recited in claim 5, wherein said output network provides in combination with the output impedance of each one of said second transistors, an output network having a predetermined characteristic impedance substantially equal to the characteristic impedance of a load coupled to an output terminal of said combination.

10. The combination, as recited in claim 4, wherein said first transistors have emitter electrodes coupled to emitter electrodes of said second transistors and wherein said first transistors are a first one of p-n-p and n-p-n type and said second transistors are a different one of p-n-p and n-p-n type.

11. The combination, as recited in claim 10, wherein the input means provides i combination with the input impedance of each one of the first transistors, a network having a predetermined characteristic impedance substantially related to an impedance of a signal source coupled to an input terminal of said combination.

12. The combination, as recited in claim 10 wherein each one of said transistors are heterojunction bipolar transistors comprised of Group III-V semiconductor materials.

13. The combination, as recited in claim 10, wherein each of the plurality of capacitors, the input propagation network, and input impedances of said plurality of transistors, provides said input propagation network having a characteristic impedance substantially related to a characteristic impedance of a source coupled to an input terminal of said combination.

14. The combination, as recited in claim 10, wherein said output means provides in combination with the output impedance of each one of said second transistors, a network having a characteristic impedance substantially related to a characteristic impedance of a load coupled an output terminal of said combination.

15. A distributed amplifier, comprising:

a plurality of pairs of cascode coupled first and second heterojunction bipolar transistors each one of said transistors having a base electrode, an emitter electrode, and a collector electrode, with first transistors of each of the pairs of transistors disposed to have an emitter electrode biased at a reference potential and a second one of said transistors of each of the pairs of transistors disposed to have a base electrode coupled to a reference potential, and with the collector electrode of each of the first transistors being coupled to the emitter electrode of the corresponding second transistor of each one of the pairs of transistors;

an input propagation network comprised of a plurality of transmission lines disposed to successively couple the base electrodes of each of the first transistors to an input terminal of the amplifier;

a corresponding plurality of capacitors with each first transistor having one of said capacitors disposed between the input propagation network and the base electrode of said first transistor; and an output propagation network comprised of a plurality of transmission lines disposed to coupled collector electrodes of the second transistor of each of the plurality of pairs of transistors to an output terminal of the amplifier.

16. The circuit, as recited in claim 15, wherein said heterojunction bipolar transistors are comprised of Group III-V materials.

17. The circuit, as recited in claim 16, wherein the input propagation network, the plurality of capacitors, and the input impedance of each one of said first transistors are selected to provide the input network having a predetermined characteristic impedance related to the characteristic impedance of a signal source coupled to said input network.

18. The circuit, as recited in claim 16, wherein said output propagation network and the output impedances of each one of said second transistors of the plurality of pairs of transistors are selected to provide the output network having a predetermined characteristic impedance in accordance with the impedance of a load coupled to said network.

19. A distributed amplifier, comprising:

a plurality of push-pull coupled first and second pairs of cascode coupled transistors, each transistor in each pair having base, collector, and emitter electrodes with each pair disposed to have a first transistor coupled in a common emitter configuration, such emitter electrode being biased at a reference potential, and a second transistor coupled to said first transistor with said second transistor coupled in a common base configuration with each transistor of the first pair of transistors being n-p-n type transistors and each of the transistors in the second pair of transistors being p-n-p type transistors;

an input propagation network disposed to successively couple to an input terminal of the amplifier at one of a plurality of common nodes corresponding to the plurality of push-pull coupled first and second pairs, the base electrodes of the first transistors of the first and second pair of transistors; and an output propagation network disposed to successively couple to an output terminal of the amplifier at one of a plurality of common nodes corresponding to the plurality of push-pull coupled first and second pairs, the collector electrodes of the second transistors of each of the first and second pairs of transistors.

20. The combination recited in claim 1 wherein the reference electrode of the first transistor is coupled to the reference potential through a non-power dissipating means.

21. The combination recited in claim 1 wherein the reference electrode of the first transistor is directly connected the reference potential, such reference potential being substantially invariant with the level of current through the reference electrode.

22. The combination recited in claim 4 wherein the first one of the collector and emitter electrodes is coupled to the reference potential through a non-power dissipating means.

23. The combination recited in claim 4 wherein the the first one of the collector and emitter electrodes is directly connected the reference potential, such reference potential being substantially invariant with the level of current through the reference electrode.

24. The combination recited in claim 15 wherein the emitter electrode of the first transistors is coupled to the reference potential through a non-power dissipating means.

25. The combination recited in claim 15 wherein the emitter electrode of the first transistors is directly connected the reference potential, such reference potential being substantially invariant with the level of current through the reference electrode.

26. The combination recited in claim 19 wherein the emitter electrode of the first transistor is coupled to the reference potential through a non-power dissipating means.

27. The combination recited in claim 19 wherein the emitter electrode of the first transistor is directly connected the reference potential, such reference potential being substantially invariant with the level of current through the reference electrode.

* * * * *